(12) United States Patent
Moon et al.

(10) Patent No.: US 11,306,386 B2
(45) Date of Patent: Apr. 19, 2022

(54) MASK REPAIRING APPARATUS AND MASK REPAIRING METHOD

(71) Applicant: SAMSUNG DISPLAY CO., LTD., Yongin-si (KR)

(72) Inventors: Youngmin Moon, Yongin-si (KR); Sungsoon Im, Yongin-si (KR); Jungwoo Ko, Yongin-si (KR); Sangmin Lee, Yongin-si (KR); Youngchul Lee, Yongin-si (KR); Kyuhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 226 days.

(21) Appl. No.: 16/545,173

(22) Filed: Aug. 20, 2019

(65) Prior Publication Data

US 2020/0131618 A1 Apr. 30, 2020

(30) Foreign Application Priority Data

Oct. 24, 2018 (KR) .................. 10-2018-0127506

(51) Int. Cl.
```
B23K 26/03      (2006.01)
C23C 14/04      (2006.01)
B23K 26/066     (2014.01)
C23C 16/04      (2006.01)
B23K 26/362     (2014.01)
```

(52) U.S. Cl.
CPC ............ *C23C 14/042* (2013.01); *B23K 26/03* (2013.01); *B23K 26/032* (2013.01); *B23K 26/066* (2015.10); *B23K 26/362* (2013.01); *C23C 14/048* (2013.01); *C23C 16/042* (2013.01)

(58) Field of Classification Search
CPC .. C23C 14/042; B23K 26/032; B23K 26/362; G03F 1/72
See application file for complete search history.

(56) References Cited

U.S. PATENT DOCUMENTS

| 2012/0140060 A1* | 6/2012 | Tsuchiya .......... G01N 21/95607 348/126 |
| 2015/0068455 A1* | 3/2015 | Lee ...................... B23K 26/382 118/504 |
| 2015/0259780 A1 | 9/2015 | Mizumura |

FOREIGN PATENT DOCUMENTS

| JP | 5861494 B2 | 2/2016 |
| JP | 5958824 B2 | 8/2016 |
| KR | 10-1162439 B1 | 7/2012 |
| KR | 10-1553290 B1 | 9/2015 |
| KR | 10-2018-0001666 A | 1/2018 |

* cited by examiner

*Primary Examiner* — Binh X Tran
(74) *Attorney, Agent, or Firm* — Lewis Roca Rothgerber Christie LLP

(57) ABSTRACT

A mask repairing apparatus may include a stage, a stereoscopic imaging unit to measure a stereoscopic image of a mask on the stage, a control unit to compare the stereoscopic image with a normal image of the mask and to produce a defect image of the mask, and a laser unit to irradiate a laser beam onto a deficient part of the mask, under control of the control unit. The control unit may control the laser unit, based on the defect image, such that the laser beam is sequentially irradiated onto m multiple layers of the deficient part while repeatedly moving in a first direction and a second direction crossing each other.

10 Claims, 16 Drawing Sheets

MASK REPAIRING APPARATUS AND MASK REPAIRING METHOD

CROSS-REFERENCE TO RELATED APPLICATION

Korean Patent Application No. 10-2018-0127506, filed on Oct. 24, 2018, in the Korean Intellectual Property Office, and entitled: "Mask Repairing Apparatus and Mask Repairing Method," is incorporated by reference herein in its entirety.

BACKGROUND

1. Field

The present disclosure relates to a mask repairing apparatus and a mask repairing method.

2. Description of the Related Art

An organic light emitting diode (OLED) display device has been attracting attention as a next generation flat panel display device, because it provides excellent luminance and viewing angle characteristics, without a light source unit as required for a liquid crystal display (LCD) device. Since there is no need for the light source unit, the OLED display device can be made lighter and thinner than the LCD device. In addition, the OLED display device has other technical advantages (e.g., low power consumption, high luminance, and high response speed).

The OLED display device includes a plurality of organic light emitting devices, each of which includes an anode, an organic light emitting layer, and a cathode. When holes and electrons are injected from the anode and the cathode, respectively, into the organic light emitting layer, excitons are formed in the organic light emitting layer. When the excitons undergo a transition to the ground state, light is emitted from the organic light emitting device.

A process of fabricating the organic light emitting devices includes placing a mask on a substrate and providing an organic material onto the substrate through openings of the mask. With recent advance in technology, there is an increasing demand for a high-resolution display device and, thus, to increase the number of organic light emitting devices in a display device.

SUMMARY

According to an embodiment, a mask repairing apparatus may include a stage, a stereoscopic imaging unit configured to measure a stereoscopic image of a mask disposed on the stage, a control unit configured to compare the stereoscopic image with a normal image of the mask and to produce a defect image of the mask, and a laser unit configured to irradiate a laser beam onto a deficient part of the mask, under control of the control unit. The control unit may control the laser unit, based on the defect image, such that the laser beam is sequentially irradiated onto m multiple layers of the deficient part while repeatedly moving in a first direction and a second direction crossing each other.

According to an embodiment, a mask repairing method may include producing a stereoscopic image of a mask, in which a plurality of openings are defined, comparing the stereoscopic image with a normal image of the mask to produce a defect image of the mask, and irradiating a laser beam onto a deficient part of the mask to remove the deficient part, based on the defect image. The laser beam may be sequentially irradiated onto m multiple layers of the deficient part while repeatedly moving in a first direction and a second direction crossing each other to sequentially remove the m multiple layers.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
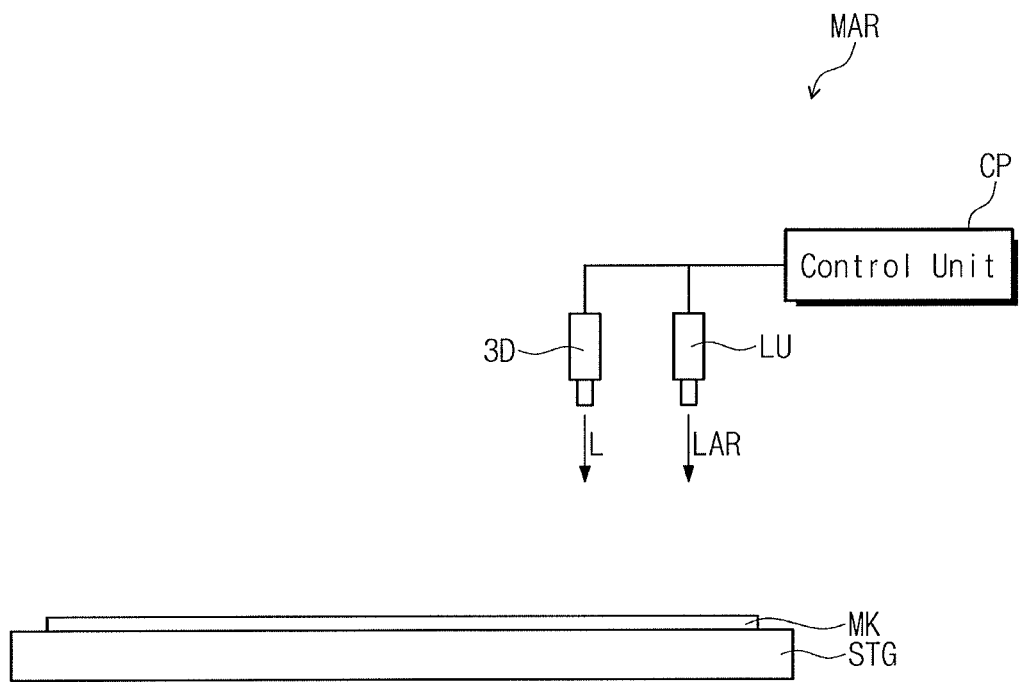
FIG. 1 illustrates a structure of a mask repairing apparatus according to an embodiment.

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 illustrates a mask repairing apparatus according to an embodiment. Referring to FIG. 1, a mask repairing apparatus MRA according to an embodiment may include a stage STG, a stereoscopic image measurement unit (hereinafter, a stereoscopic imaging unit) (3D), a laser unit LU, and a control unit CP.

A mask MK, on which a repairing process will be performed, may be on the stage STG. The mask MK may be formed of or include a metallic material, e.g., may be a fine metal mask (FMM). The mask MK may have an elongated shape and a plurality of openings defined therein. Details of the mask MK will be described below.

The stereoscopic imaging unit (3D) may be positioned above the mask MK and may measure a three-dimensional surface profile of the mask MK. Various non-contact type measurement apparatuses may be used as the stereoscopic imaging unit (3D). For example, a phase shifting interferometer, a white-light scanning interferometer, a confocal scanning microscope system, and the like, may be used as the stereoscopic imaging unit (3D).

The stereoscopic imaging unit (3D) may irradiate a light L onto the mask MK to measure a surface profile of the mask MK. The light L may be incident orthogonally to an upper surface of the mask MK. The surface profile of the mask MK may be defined as a stereoscopic image of a surface of the mask MK. The stereoscopic image of the mask MK obtained by the stereoscopic imaging unit (3D) may be provided to the control unit CP.

The control unit CP may compare the stereoscopic image of the mask MK with a normal image of the mask MK to produce defect images corresponding to deficient parts of the mask MK. The control unit CP may control a position of the laser unit LU to allow a laser beam LAR to irradiate the deficient parts of the mask MK, based on the defect images.

The laser unit LU may generate the laser beam LAR and may irradiate the laser beam LAR onto the deficient parts of the mask MK, under the control of the control unit CP. The laser unit LU may irradiate the laser beam LAR onto the deficient parts of the mask MK, while repeatedly moving in a first direction and a second direction crossing each other and parallel to the upper surface of the mask MK. This operation will be described in more detail below. When the deficient parts of the mask MK are removed by the laser beam LAR, the mask MK may be in a repaired state.

Detailed operations of the stereoscopic imaging unit (3D), the laser unit LU, and the control unit CP will be described below.

Figure 2:
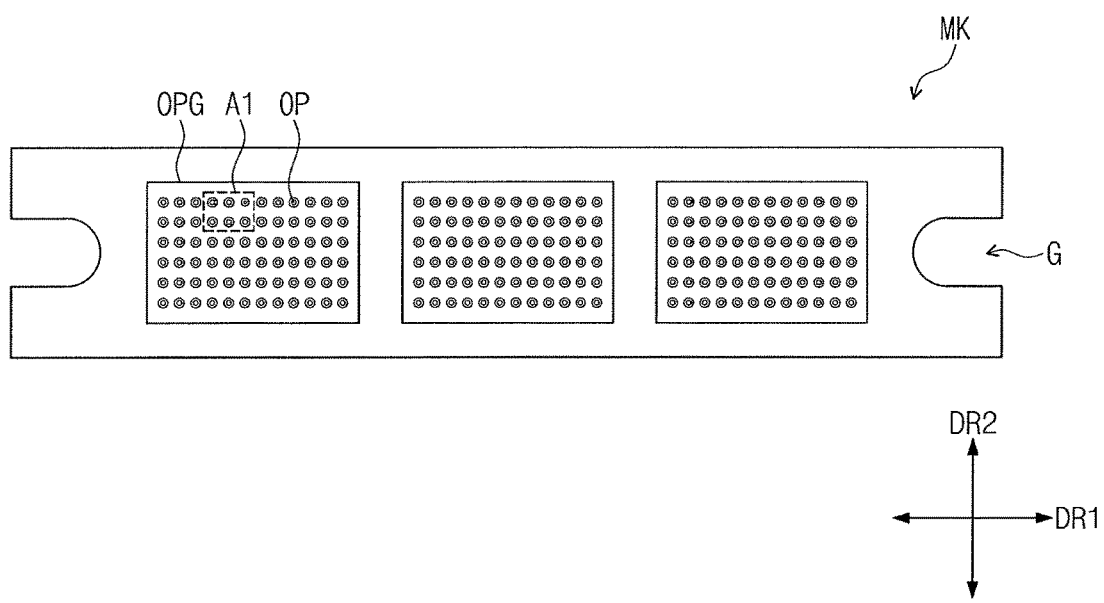
FIG. 2 illustrates a planar structure of a mask of FIG. 1.

FIG. 2 is a diagram illustrating a planar structure of a mask of FIG. 1. Referring to FIG. 2, the mask MK may have an elongated shape extending in a first direction DR1. The mask MK may include a plurality of opening groups OPG with a plurality of openings OP defined in each of the opening groups OPG.

The openings OP may include normal openings and abnormal openings. The abnormal openings will be described in more detail with reference to FIGS. 3 and 4. The openings OP may be arranged in a shape.

A recess G may be defined in each of opposite ends of the mask MK in the first direction DR1. A direction crossing the first direction DR1 may be defined as a second direction DR2.

While three opening groups OPG are illustrated, any number of opening groups may be provided. A plurality of substrates may be under the opening groups OPG, respectively, and an organic material for forming organic light emitting layers may be deposited on the substrates through the openings OP of the opening groups OPG.

Figure 3:
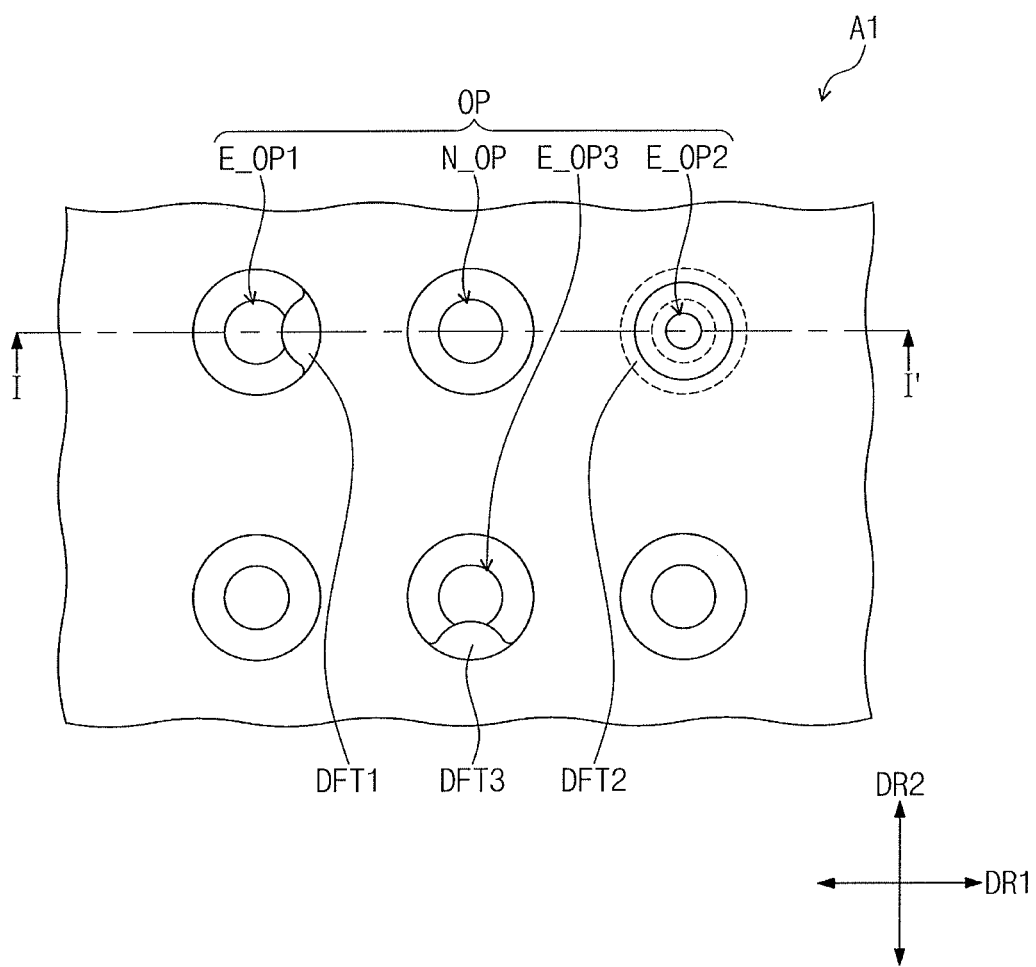
FIG. 3 illustrates abnormal openings formed in the mask of FIG. 2.
Figure 4:
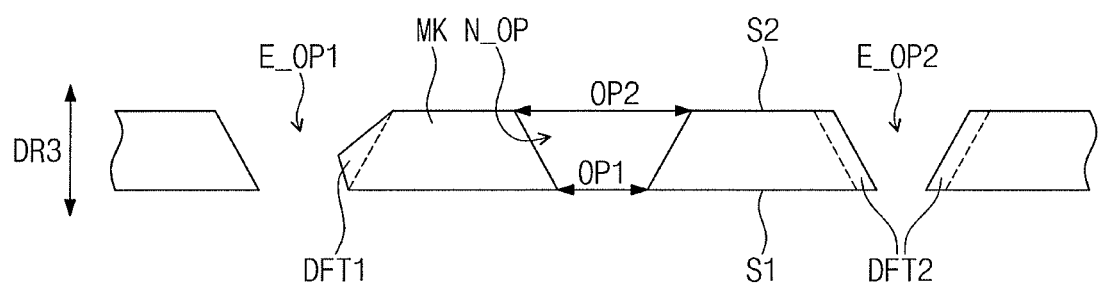
FIG. 4 illustrates a sectional view taken along a line I-I' of FIG. 3.

FIG. 3 is an enlarged view of a first region A1 of the mask of FIG. 2. FIG. 4 is a sectional view taken along a line I-I' of FIG. 3. As an example, an enlarged shape of a first region of the mask MK with abnormal openings E_OP1, E_OP2, and E_OP3 is illustrated in FIG. 3.

Referring to FIGS. 3 and 4, the openings OP may include normal openings N_OP and abnormal openings E_OP1, E_OP2, and E_OP3. The normal openings N_OP may be circular. In an implementation, the normal openings N_OP may have various shapes, such as elliptical, rectangular, diamond shapes, and the like.

A width along the first direction DR1 of each of the normal openings N_OP may increase in a third direction DR3, crossing both the first and second directions DR1, DR2, from a first surface S1 of the mask MK toward a second surface S2 of the mask MK, which is located opposite to the first surface S1. The second surface S2 may be above the first surface S1. The width may be a value measured in a horizontal direction, e.g., the first direction. A width of a first opening OP1 on the first surface S1 of the mask MK may be smaller than a width of a second opening OP2 defined in the second surface S2 of the mask MK. Similarly, along the second direction DR2, a width of the first opening OP1 on the first surface S1 of the mask MK may be smaller than a width of a second opening OP2 defined in the second surface S2 of the mask MK.

The abnormal openings E_OP1, E_OP2, and E_OP3 may have shapes different from the normal openings N_OP. The mask MK may include deficient parts DFT1, DFT2, and DFT3 defining the abnormal openings E_OP1, E_OP2, and E_OP3, respectively.

The deficient parts DFT1, DFT2, and DFT3 of the mask MK may be defined as portions that have shapes different from portions of the mask MK defining the normal openings N_OP, at portions of the mask MK defining the abnormal openings E_OP1, E_OP2, and E_OP3. For example, when the abnormal openings E_OP1, E_OP2, and E_OP3 are compared or overlapped with the shapes of the normal openings N_OP, there may be a portion having a difference in shape. Such portions may be defined as the deficient parts DFT1, DFT2, and DFT3. As an example, the shape of the normal openings N_OP is depicted by a dotted line in FIG. 4 relative to the abnormal openings E_OP1 and E_OP2.

A size of each of the abnormal openings E_OP1, E_OP2, and E_OP3 may be smaller than a size of each of the normal openings N_OP. The abnormal openings may have a non-circular shape, e.g., abnormal openings E_OP1 and E_OP2, or may have a circular shape with a smaller diameter than that of the normal openings N_OP, e.g., abnormal opening E_OP3.

The abnormal openings E_OP1, E_OP2, and E_OP3 may include a first abnormal opening E_OP1, a second abnormal opening E_OP2, and a third abnormal opening E_OP3. A first deficient part DFT1 may protrude in the first direction DR1 to define the first abnormal opening E_OP1. A second deficient part DFT2 may define the second abnormal opening E_OP2, which is circular and is smaller than the normal openings N_OP. A third deficient part DFT3 may protrude in the second direction DR2 to define the third abnormal opening E_OP3. The third deficient part DFT3 and the second deficient part DFT2 may have sectional structures similar to each other, except for a difference in the orientation of the protrusion.

As an example, the first and third deficient parts DFT1 and DFT3 are illustrated to protrude in the first and second directions DR1 and DR2, respectively. In an implementation, the mask MK may include deficient parts protruding in various directions. In addition, the second abnormal opening E_OP2 is illustrated to be smaller than the normal openings N_OP. As an example, a region for the normal opening N_OP may be closed. In this case, the opening OP is not formed.

Figure 5:
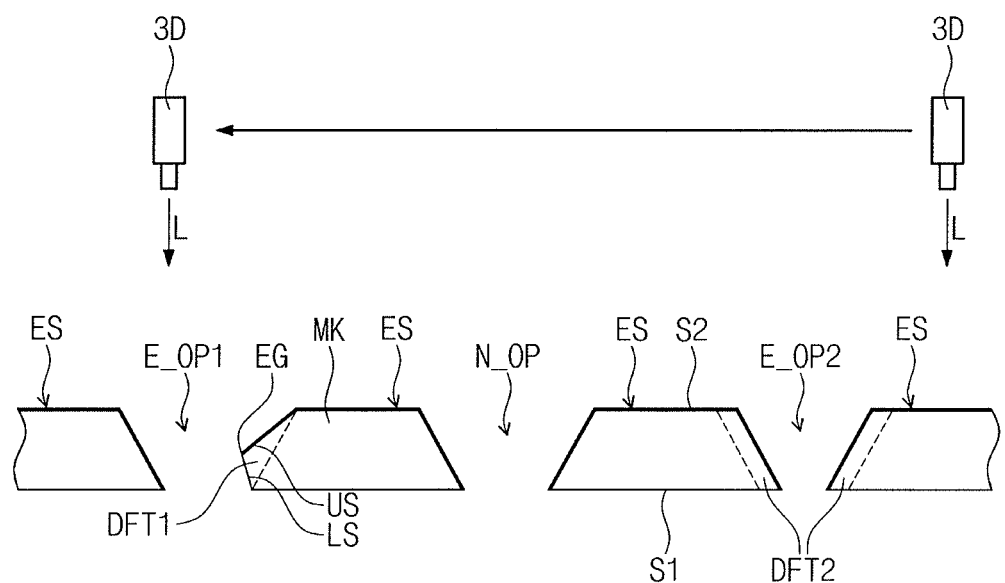
FIG. 5 illustrates an operation of a stereoscopic imaging unit of FIG. 1.

FIG. 5 illustrates an operation of a stereoscopic imaging unit of FIG. 1. For convenience in illustration and description, FIG. 5 illustrates a vertical section corresponding to FIG. 4. Hereinafter, an operation of measuring a stereoscopic image of a portion of the mask MK, in which the first abnormal opening E_OP1, the second abnormal opening E_OP2, and the normal opening N_OP are formed, will be described.

Referring to FIG. 5, the stereoscopic imaging unit (3D) may be over the mask MK to irradiate the light L onto the mask MK while moving over the mask MK, e.g., along the first and second directions DR1, DR2. The stereoscopic imaging unit (3D) may irradiate light onto the mask MK to measure the stereoscopic image of the mask MK.

An exposed surface ES of the mask MK, which is exposed when viewed in a top plan view of the mask MK, may be measured as a stereoscopic image of a surface of the mask MK. For convenience in illustration and description, in FIG. 5, the exposed surface ES of the mask MK is depicted by a line thicker than other surfaces of the mask MK.

Since the light L is provided from a region above the mask MK toward the mask MK, e.g., orthogonal to the mask MK, the exposed surface ES of the mask MK may be irradiated by the light L. In other words, the exposed surface includes surfaces on which the light L is incident. The stereoscopic imaging unit (3D) may measure a stereoscopic image of the exposed surface ES irradiated with the light L.

The first deficient part DFT1 having a protruding structure may include a top or upper surface US that is exposed in the top plan view and a bottom or lower surface LS that is not exposed in the top plan view. Thus, the top surface US is exposed to the light L and the bottom surface LS is not exposed to the light L.

A border between the top surface US and the bottom surface LS may be defined as an edge EG of the first deficient part DFT1. The edge EG may not be located at the same level as the first surface S1 of the mask MK. For example, the edge EG may be between the first and second surfaces S1 and S2 of the mask MK.

The top surface US of the first deficient part DFT1 exposed to the light L may be measured in the stereoscopic image. The bottom surface LS of the first deficient part DFT1, which is not exposed to the light L, may not be measured in the stereoscopic image.

A stereoscopic image of a portion of the mask MK defining the third abnormal opening E_OP3e may be measured, similar to a portion of the mask MK defining the first abnormal opening E_OP1.

Figure 6:
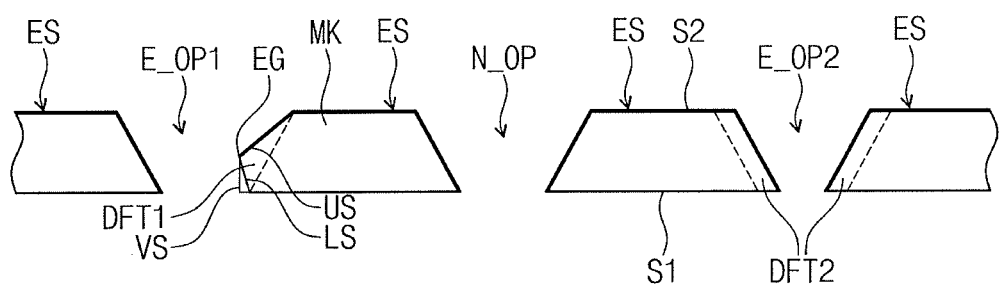
FIG. 6 illustrates an operation of correcting a stereoscopic image, which is obtained by the stereoscopic imaging unit of FIG. 5, using a control unit.

FIG. 6 is a diagram exemplarily an operation of correcting a stereoscopic image obtained by the stereoscopic imaging unit of FIG. 5, using a control unit. Referring to FIG. 6, the exposed surface ES of the mask exposed by the light L may be measured by the stereoscopic image, and the stereoscopic image may be provided to the control unit CP. However, the bottom surface LS of the first deficient part DFT1 may not be measured by the stereoscopic image.

The control unit CP may correct the stereoscopic image of the first deficient part DFT1. The control unit CP may produce a virtual image of the bottom surface LS of the first deficient part DFT1, which is not exposed to the light L and is not measured by the stereoscopic image.

The control unit CP may analyze the measured stereoscopic image and may set a virtual side surface VS to be perpendicular from the edge EG to a bottom of the mask MK, when the edge EG of the first deficient part DFT1 is located between the first surface S1 and the second surface S2. That is, the virtual side surface VS may have a perpendicular side surface, e.g., extend along the third direction DR3 towards the second surface S2.

A bottom portion of the virtual side surface VS may be connected to the first surface S1 of the mask MK, e.g., along the first and second direction DR1, DR2. The control unit CP may combine the stereoscopic image measured by the stereoscopic imaging unit (3D) with the virtual side surface VS to produce a stereoscopic image of the first deficient part DFT1. A stereoscopic image of the third deficient part DFT3 may be corrected in the same manner as the first deficient part DFT1.

Unlike the first deficient part DFT1, the virtual side surface VS on the second deficient part DFT2 may not be produced, because an edge of the second deficient part DFT2, which is defined as a border between the top surface and the bottom surface of the second deficient part DFT2, overlaps the first surface S1 of the mask MK. In other words, since an entirety of the deficient part DFT2 is exposed to the light L, i.e., there is no edge between the first surface S1 and the second surface S2, the stereoscopic image thereof is complete. In addition, the virtual side surface VS on a normal opening E_OP may not be produced, as there are no deficient parts to be removed.

Figure 7:
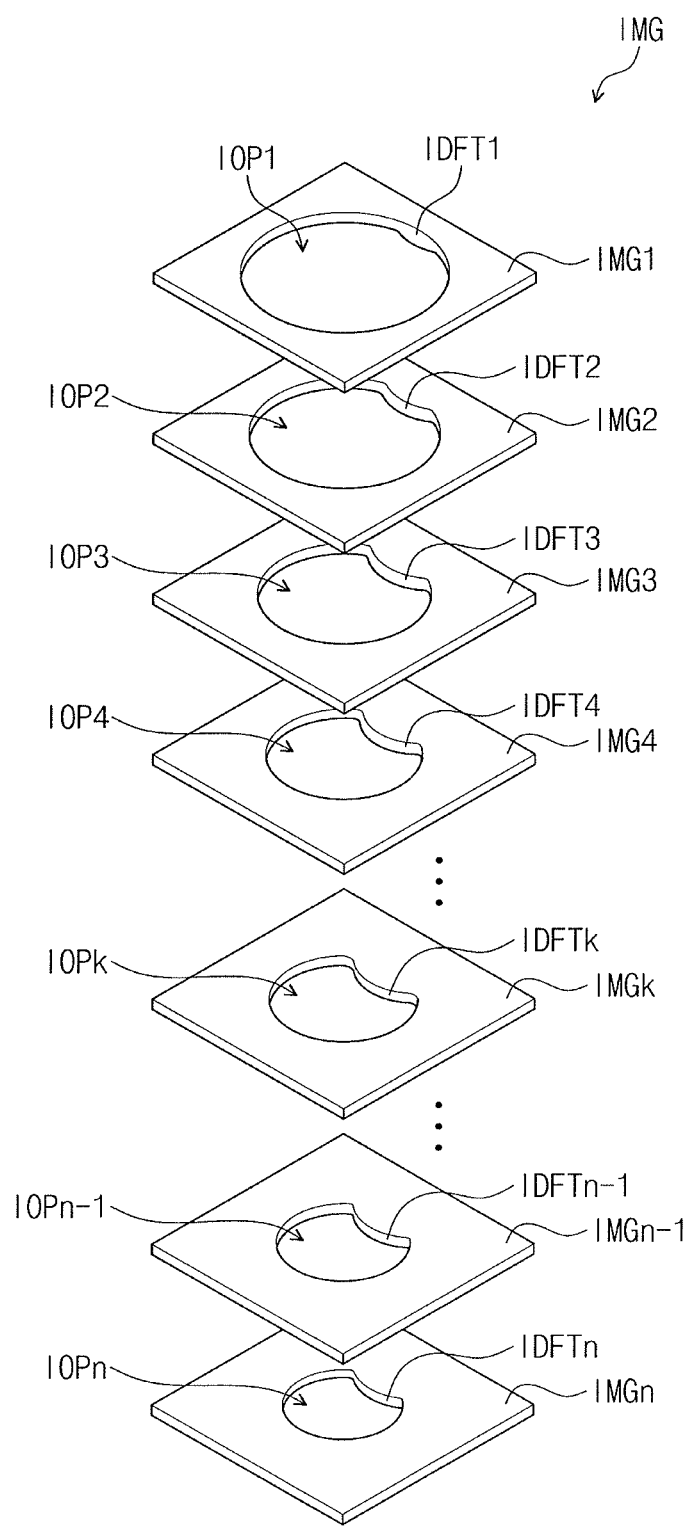
FIGS. 7 to 9 illustrate an operation of comparing a stereoscopic image with a normal image to produce a defect image, using the control unit.
Figure 8:
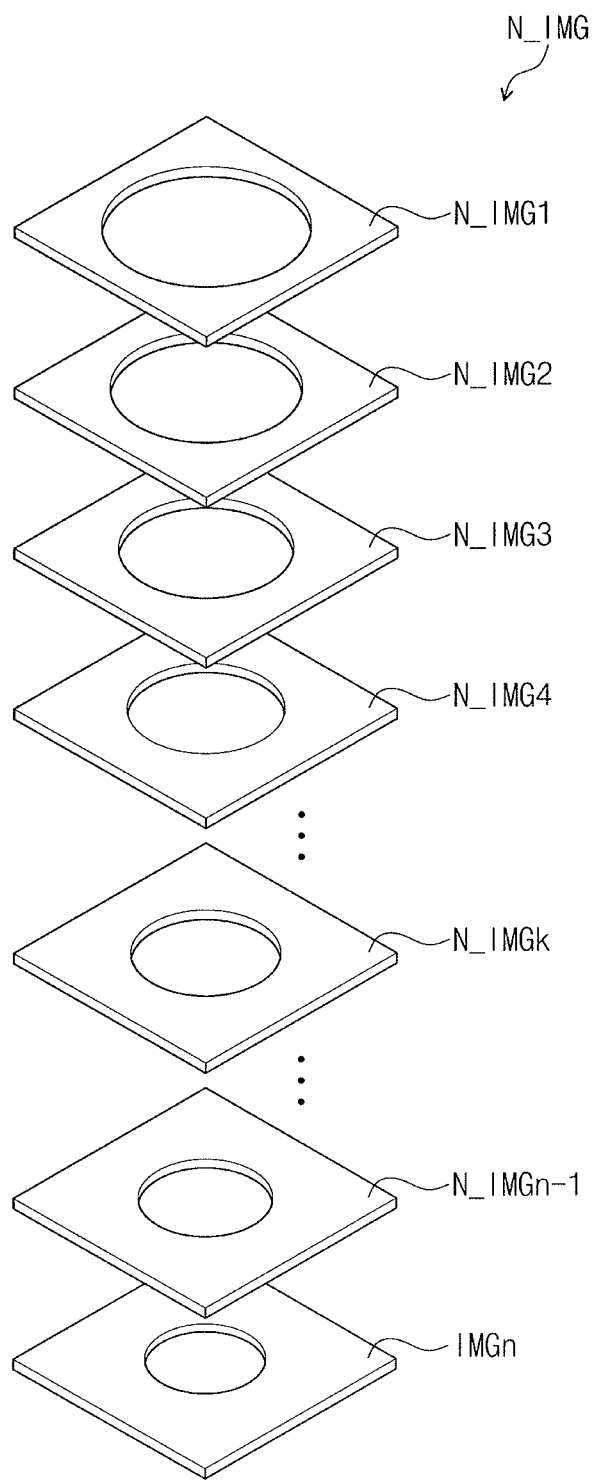
Figure 9:
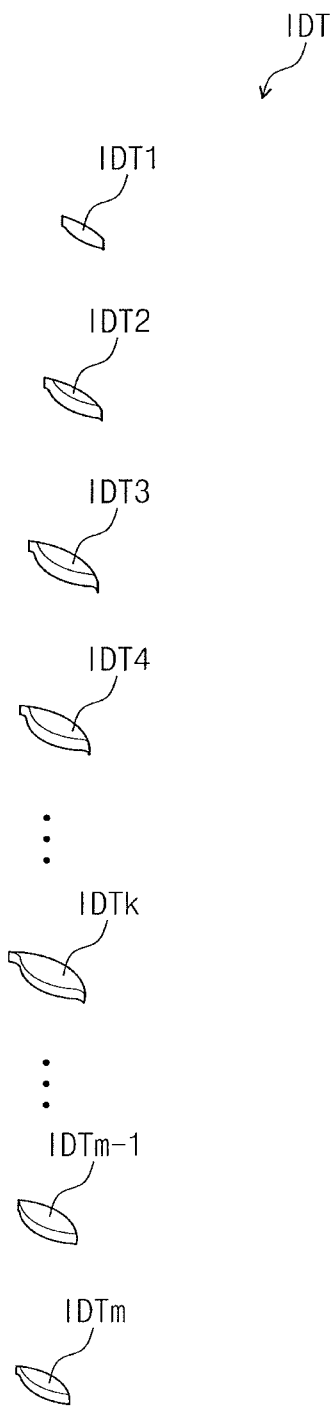

FIGS. 7 to 9 an operation of comparing a stereoscopic image with a normal image to produce a defect image, using the control unit. An operation of producing a defect image on the first deficient part DFT1 will be described as an example.

Referring to FIG. 7, the control unit CP may divide a stereoscopic image IMG into n first multi-level images IMG1-IMGn. Here, the n is a natural number. For example, the control unit CP may correct the stereoscopic image of the first deficient part DFT1 and then may divide the stereoscopic image IMG, which is obtained from a portion of the mask MK defining the first abnormal opening E_OP1, into the n first multi-level images IMG1-IMGn.

The n first multi-level images IMG1-IMGn may include n different stereoscopic images IDFT1-IDFTn and n different opening images IOP1-IOPn. A k-th image IMGk may be an image corresponding to the edge EG of the first deficient part DFT1 shown in FIG. 6. Here, the k may be a natural number.

Each of the n first multi-level images IMG1-IMGn may be an image corresponding to a thickness of about 0.5 micrometers. The thickness is measured along the third direction DR3. As an example, when the mask MK has a thickness of 20 micrometers, the number n may be 40.

Referring to FIG. 8, the control unit CP may divide a normal image N_IMG of the mask MK into n second multi-level images N_IMG1-N_IMGn. The normal image N_IMG of the mask MK may have an image whose shape is the same as that of a portion of the mask MK defining the normal opening N_OP.

The n second multi-level images N_IMG1-N_IMGn may correspond to the n first multi-level images IMG1-IMGn, respectively. Although not shown, the control unit CP may include a storage device, which is used to store the normal image N_IMG including the n second multi-level images N_IMG1-N_IMGn.

Referring to FIGS. 7, 8, and 9, the control unit CP may compare the stereoscopic image IMG with the normal image N_IMG to produce a defect image IDT. The defect image IDT may include m multi-level defect images IDT1-IDTm.

For example, the control unit CP may compare the n first multi-level images IMG1-IMGn of FIG. 7 with the n second multi-level images N_IMG1-N_IMGn of FIG. 8 to produce the m multi-level defect images IDT1-IDTm. Here, the m is a natural number that is equal to or smaller than n.

The control unit CP may subtract a region of the n second multi-level images N_IMG1-N_IMGn from a region of the n first multi-level images IMG1-IMGn, respectively. For example, the control unit CP may remove a portion corresponding to the n second multi-level images N_IMG1-N_IMGn from the n first multi-level images IMG1-IMGn. Thus, only the m multi-level defect images IDT1-IDTm may remain after the subtraction.

As a result of the above operation, the control unit CP may produce the m multi-level defect images IDT1-IDTm on the first deficient part DFT1. The m multi-level defect images IDT1-IDTm may be images, which are sliced as m layers. The m multi-level defect images IDT1-IDTm may include first to m-th defect images IDT1-IDTm, which are sequentially stacked in an upward direction.

When n first multi-level images of the mask MK defining the normal opening N_OP may have the same shape as the n second multi-level images N_IMG1-N_IMGn, there will be no remaining image after the subtraction.

Similarly, a portion corresponding to the n second multi-level images N_IMG1-N_IMGn may be removed from the stereoscopic image of the mask MK defining the second abnormal opening E_OP2 to produce m multi-level defect images on the second deficient part DFT2. Further, n multi-level defect images may be produced on the third deficient part DFT3 defining the third abnormal opening E_OP3 in the same manner as for the first abnormal opening E_OP1.

The first deficient part DFT1 may be extends from the first surface S1 to the second surface S2. In this case, the number of the m multi-level defect images IDT1-IDTm may be equal to the number of the n first multi-level images IMG1-IMGn. In other words, the number of the m multi-level defect images IDT1-IDTm may be n.

In an embodiment, a deficient part that does not extend fully between the first surface to the second surface may be occur in the mask MK. For example, the deficient part may be at layers corresponding to a k-th defect image to an m-th defect image. In this case, the number of the m multi-level defect images may be smaller than n.

Figure 10:
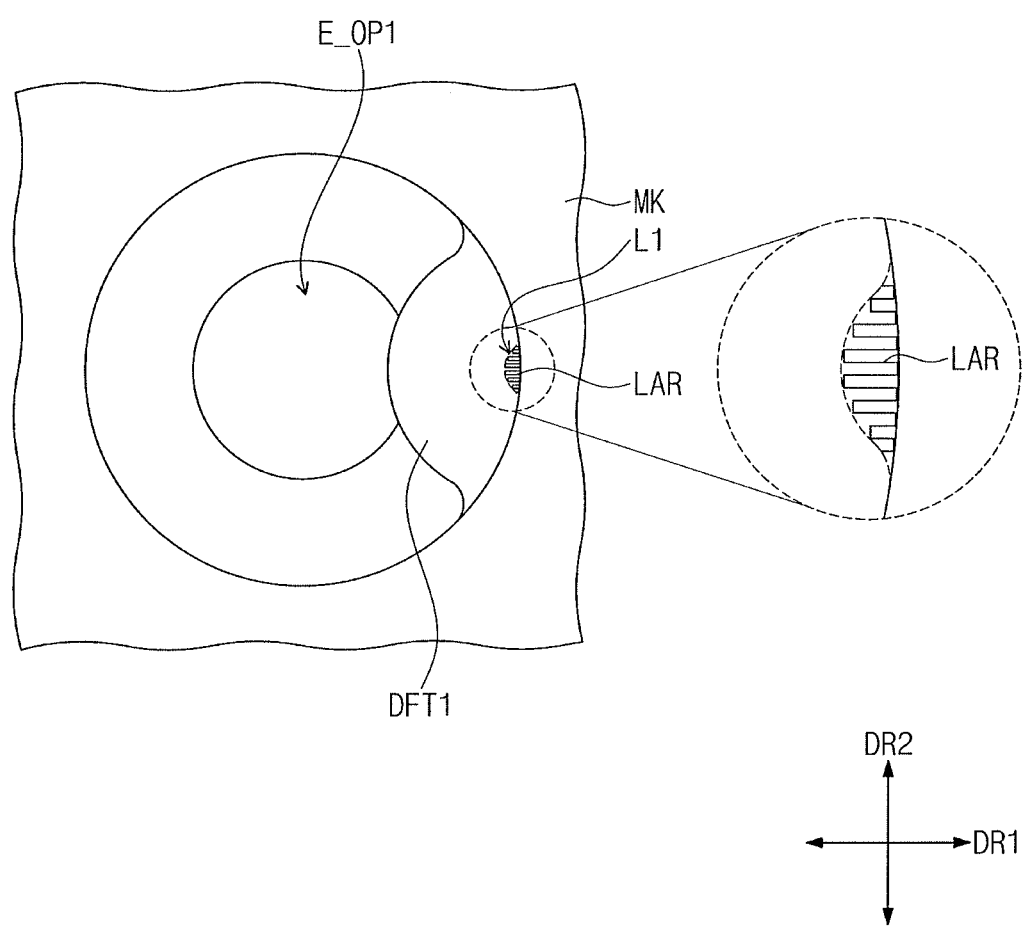
FIGS. 10 to 16 illustrate an operation of repairing a mask using a laser beam.

FIGS. 10 to 16 are diagrams illustrating an operation of repairing a mask using a laser beam. Hereinafter, an operation for removing the first deficient part DFT1 using the control unit CP and the laser unit LU will be described. FIG. 10 shows an enlarged planar shape of a portion of the mask MK defining the first abnormal opening E_OP1, and FIGS. 11 to 16 show vertical sections of the first deficient part DFT1.

Figure 11:
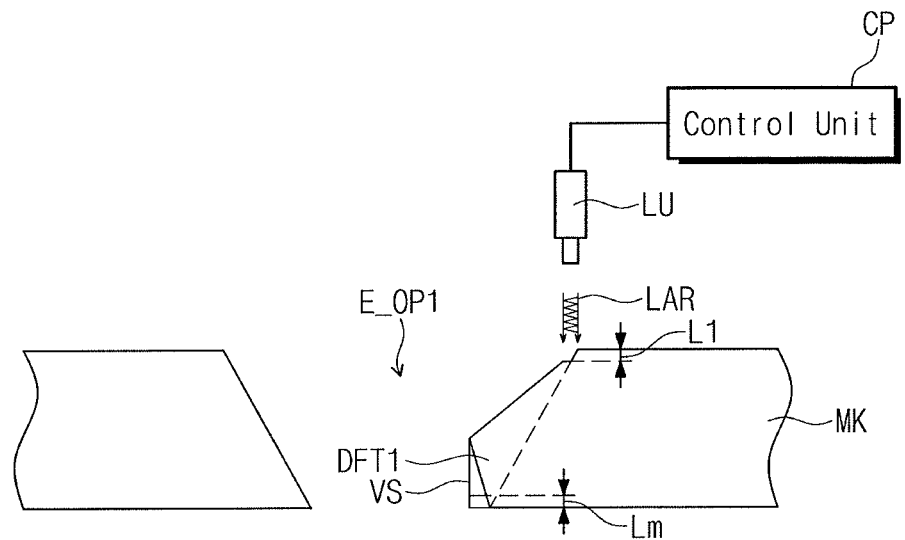

Referring to FIGS. 10 and 11, the control unit CP may control an operation of the laser unit LU, based on the m defect images IDT1-IDTm. The laser unit LU may irradiate the laser beam LAR onto the first deficient part DFT1, under the control of the control unit CP.

Under the control of the control unit CP, the laser unit LU may be repeatedly moved in the first direction DR1 and the second direction DR2. Due to the motion of the laser unit LU, the laser beam LAR may be irradiated onto the first deficient part DFT1, while repeatedly moving in the first direction DR1 and the second direction DR2. In other words, the laser beam may be scanned along the first direction DR1 and then moved along the second direction DR2 to again scan along the first direction DR1.

The first deficient part DFT1 may be divided into m multiple layers L1-Lm corresponding to the m defect images IDT1-IDTm. The m multiple layers L1-Lm may include first to m-th layers L1-Lm, which correspond to the first to m-th defect images IDT1-IDTm, respectively.

Based on the m multi-level defect images IDT1-IDTm, the control unit CP may control the laser unit LU such that the laser beam LAR is sequentially irradiated onto the m multiple layers L1-Lm of the first deficient part DFT1. The laser beam LAR may be irradiated onto the first layer L1, which is the topmost layer of the first to m-th multiple layers L1-Lm, and then may be sequentially irradiated onto other layers of the first to m-th multiple layers L1-Lm.

Based on the first defect image IDT1, the control unit CP may control the laser unit LU such that the laser beam LAR is firstly irradiated onto the first layer L1 corresponding to the first defect image IDT1.

A diameter of a spot of the laser beam LAR may be substantially equal to or larger than 0 μm and may be less than 20 μm. A wavelength of the laser beam LAR may range 500 nm to 550 nm. A moving distance of the laser beam LAR may be larger in the first direction DR1 than in the second direction DR2, i.e., the laser beam LAR may be scanned along the first direction DR1, translated along the second direction DR2, and then scanned along the first direction DR1.

Figure 12:
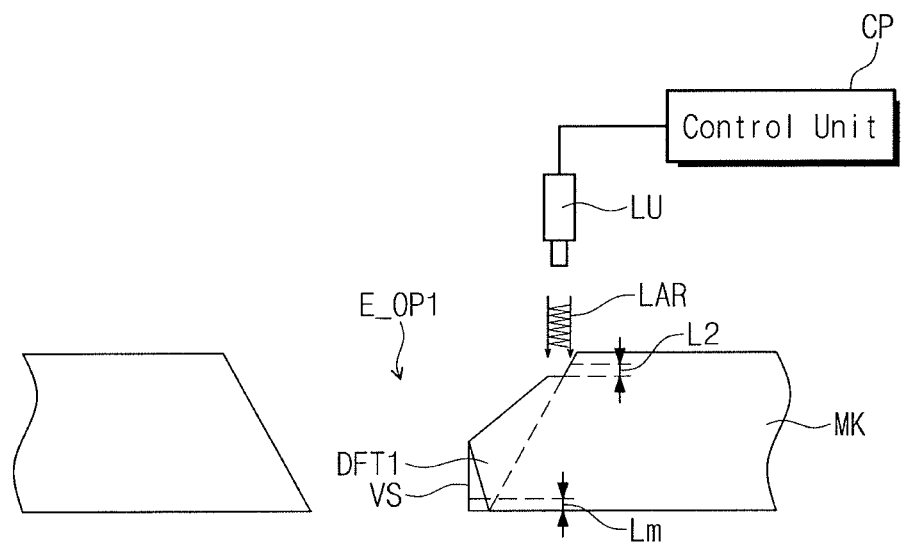

Referring to FIG. 12, the control unit CP may control the laser unit LU, based on the second defect image IDT2, such that the laser beam LAR is irradiated onto the second layer L2 corresponding to the second defect image IDT2. Thus, the second layer L2 may be removed by the laser beam LAR.

Figure 13:
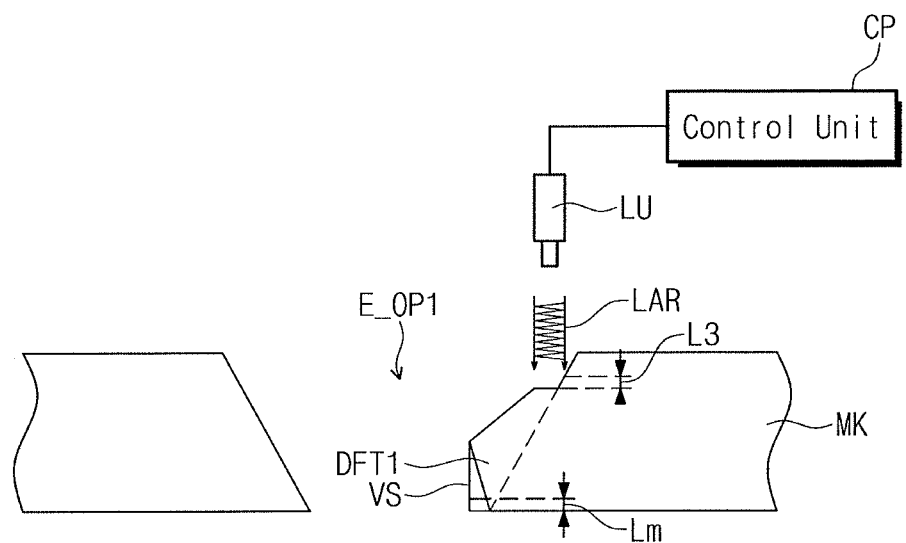

Referring to FIG. 13, the control unit CP may control the laser unit LU, based on the third defect image IDT3, such that the laser beam LAR is irradiated onto the third layer L3 corresponding to the third defect image IDT3. Thus, the third layer L3 may be removed by the laser beam LAR.

Figure 14:
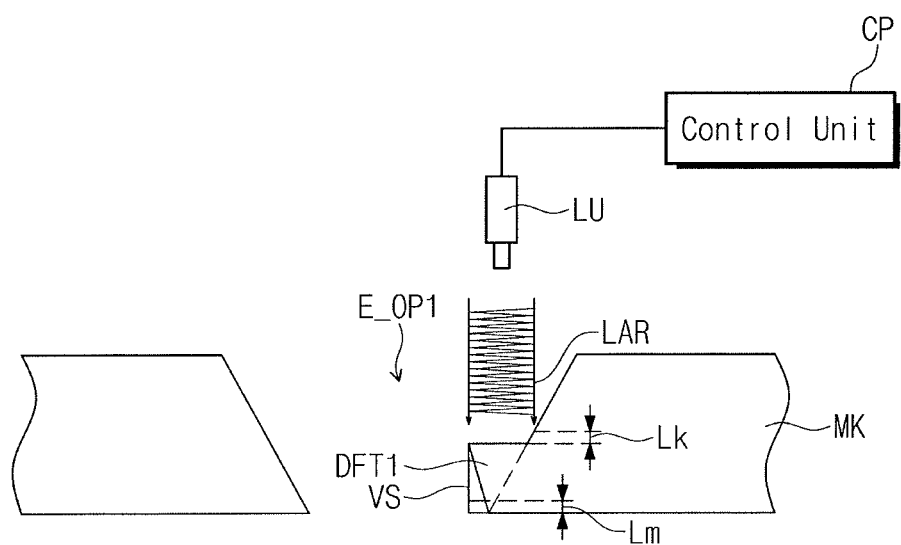

Referring to FIG. 14, the control unit CP may control the laser unit LU, based on the k-th defect image IDTk, such that the laser beam LAR is irradiated onto the k-th layer Lk corresponding to the k-th defect image IDTk. Thus, the k-th layer Lk may be removed by the laser beam LAR.

Figure 15:
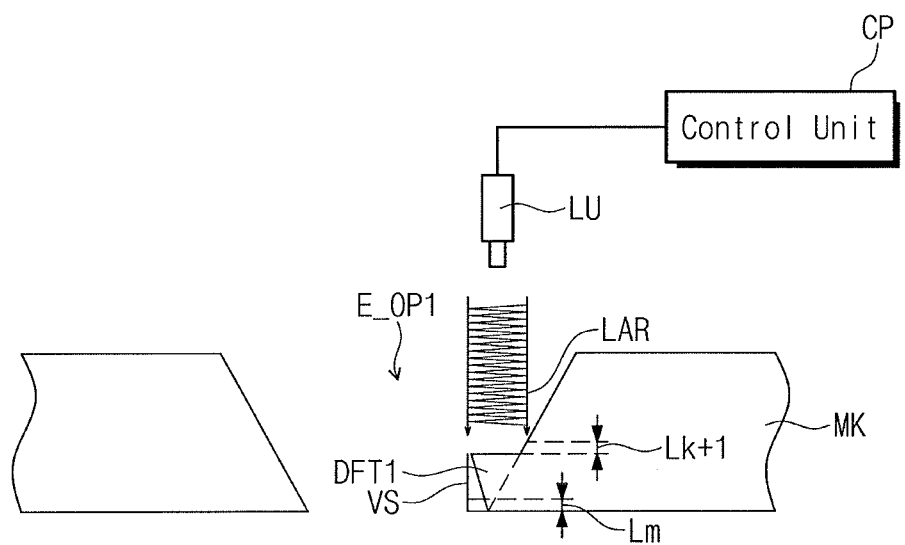

Referring to FIG. 15, the control unit CP may control the laser unit LU, based on the (k+1)-th defect image IDTk+1, such that the laser beam LAR is irradiated onto the (k+1)-th layer Lk+1 corresponding to the (k+1)-th defect image IDTk+1. Thus, the (k+1)-th layer Lk+1 may be removed by the laser beam LAR.

Since, as described above, the defect images IDT1-IDTm are produced based on the stereoscopic image IMG, at least one of the defect images IDT1-IDTm may include the virtual surface VS. Since the laser beam LAR is irradiated onto the first deficient part DFT1 based on the defect images IDT1-IDTm, the laser beam LAR may be irradiated onto a region corresponding to the virtual surface VS. However, the virtual surface VS represents an empty region of the mask MK, and thus, the process of repairing the mask MK may be normally performed, even when the laser beam LAR is irradiated onto the region corresponding to the virtual surface VS. In other words, the use of the virtual surface VS insures that the layers k to m are properly removed, even though they were not apparent from the stereoscopic image.

Figure 16:
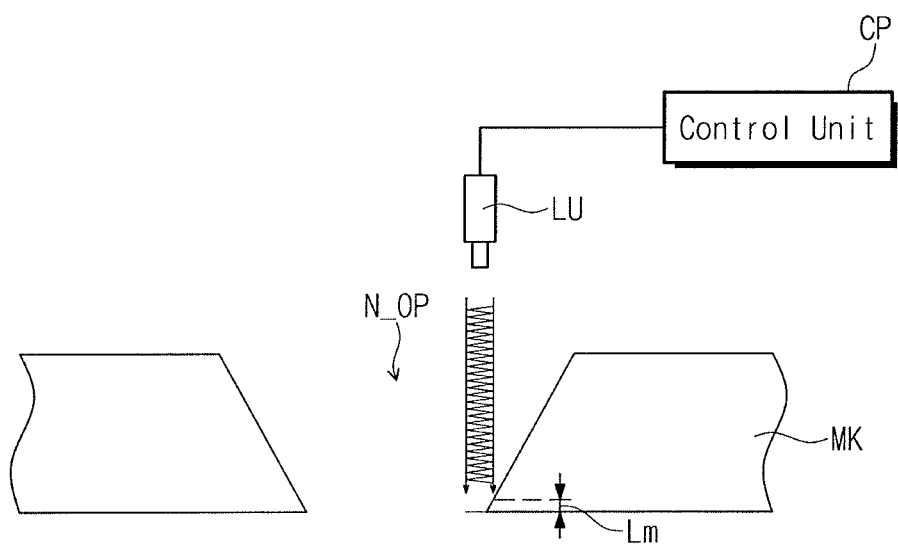

Referring to FIG. 16, the control unit CP may control the laser unit LU, based on the m-th defect image IDTm, such that the laser beam LAR is irradiated onto the m-th layer Lm corresponding to the m-th defect image IDTm. Thus, the m-th layer Lm may be removed by the laser beam LAR.

According to the afore-described operation, the laser beam LAR may be sequentially irradiated onto the first to m-th multiple layers L1-Lm, and thus, the first to m-th multiple layers L1-Lm may be sequentially removed. As a result, the first deficient part DFT1 may be removed, and the first abnormal opening E_OP1 may be repaired and may be used as the normal opening N_OP.

In an embodiment, the laser beam LAR may be provided to the first deficient part DFT1 while repeatedly moving in the first and second directions DR1 and DR2, and the first deficient part DFT1 may be divided into the multiple layers L1-Lm and may be sequentially removed. Thus, the first deficient part DFT1 may be precisely removed. As a result, the first abnormal opening E_OP1 may be precisely repaired and may be effectively used as a normal opening N_OP.

Figure 17:
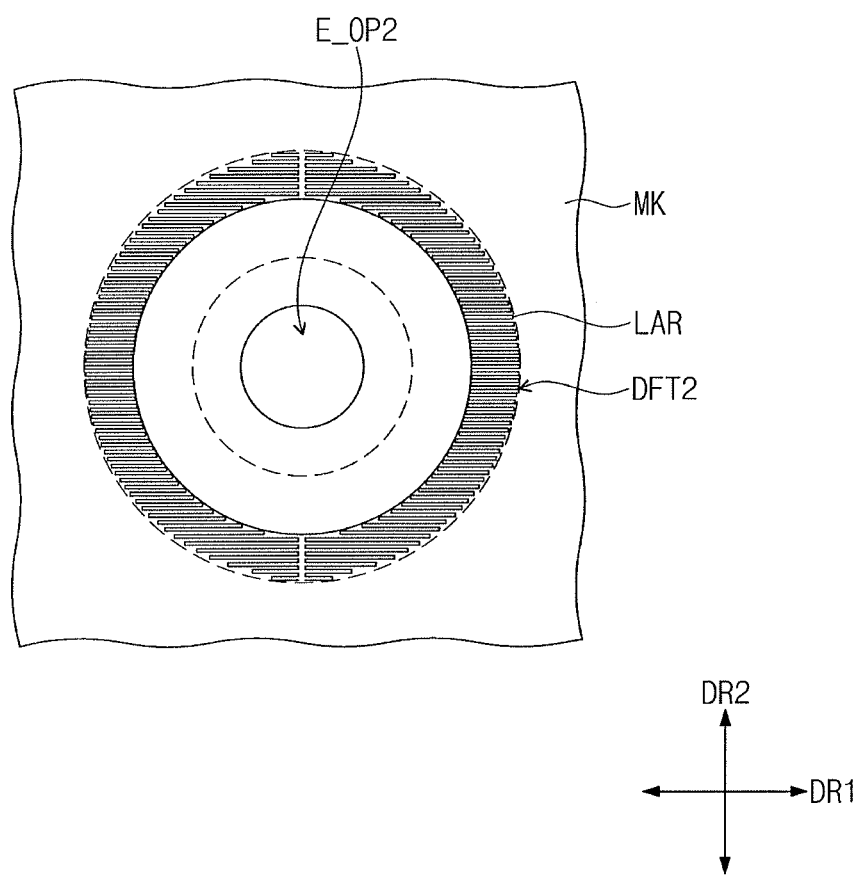
FIG. 17 illustrates an operation of removing a second deficient part.
Figure 18:
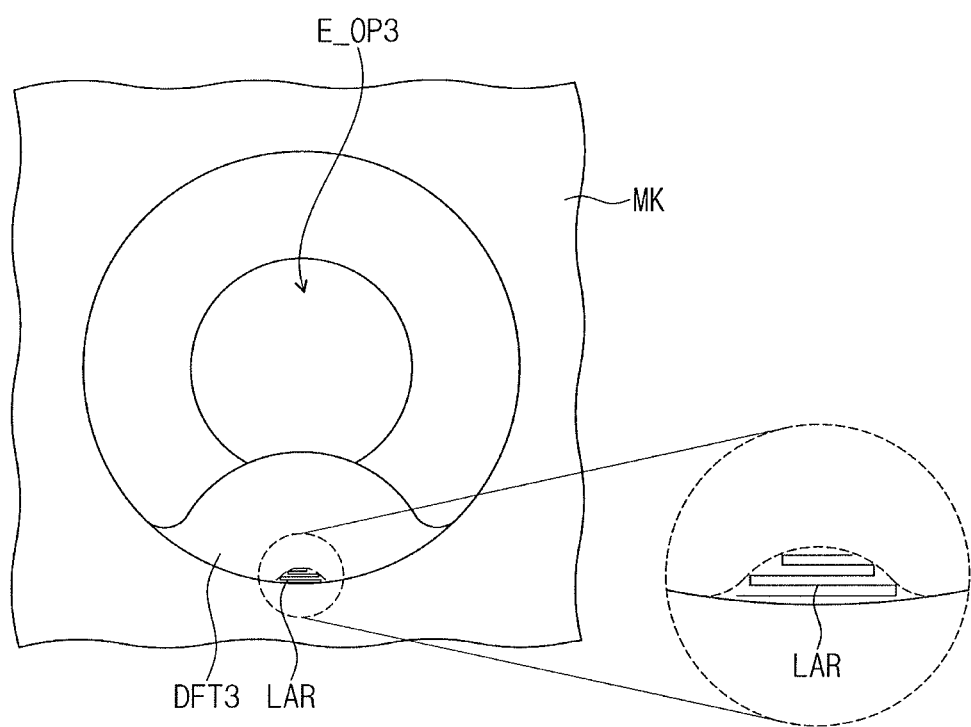
FIG. 18 illustrates an operation of removing a third deficient part.

FIG. 17 is a diagram illustrating an operation of removing a second deficient part. FIG. 18 is a diagram illustrating an operation of removing a third deficient part.

Referring to FIGS. 17 and 18, the laser beam LAR may be irradiated onto the second deficient part DFT2 and the third deficient part DFT3 while repeatedly moving in the first direction DR1 and the second direction DR2. A moving distance of the laser beam LAR may be larger in the first direction DR1 than in the second direction DR2, e.g., the laser beam LAR may scan along the first direction DR1, translated along the second direction DR2, and then scanned along the first direction DR1.

The second and third deficient parts DFT2 and DFT3 may also be removed in a manner similar to the method for removing the first deficient part DFT1. The second and third deficient parts DFT2 and DFT3 may be divided into m multiple layers and may be sequentially removed from the topmost layer. Thus, the second and third deficient parts DFT2 and DFT3 may be precisely removed, and the second and third abnormal openings E_OP2 and E_OP3 may be precisely repaired and may be effectively used as normal openings N_OP.

By using the mask repair apparatus and the mask repair method according to an embodiment, it may be possible to remove the deficient parts DFT1, DFT2, and DFT3 of the mask MK in a more precise manner and to repair the abnoimal openings E_OP1, E_OP2, and E_OP3 of the mask MK in a more precise manner.

Figure 19:
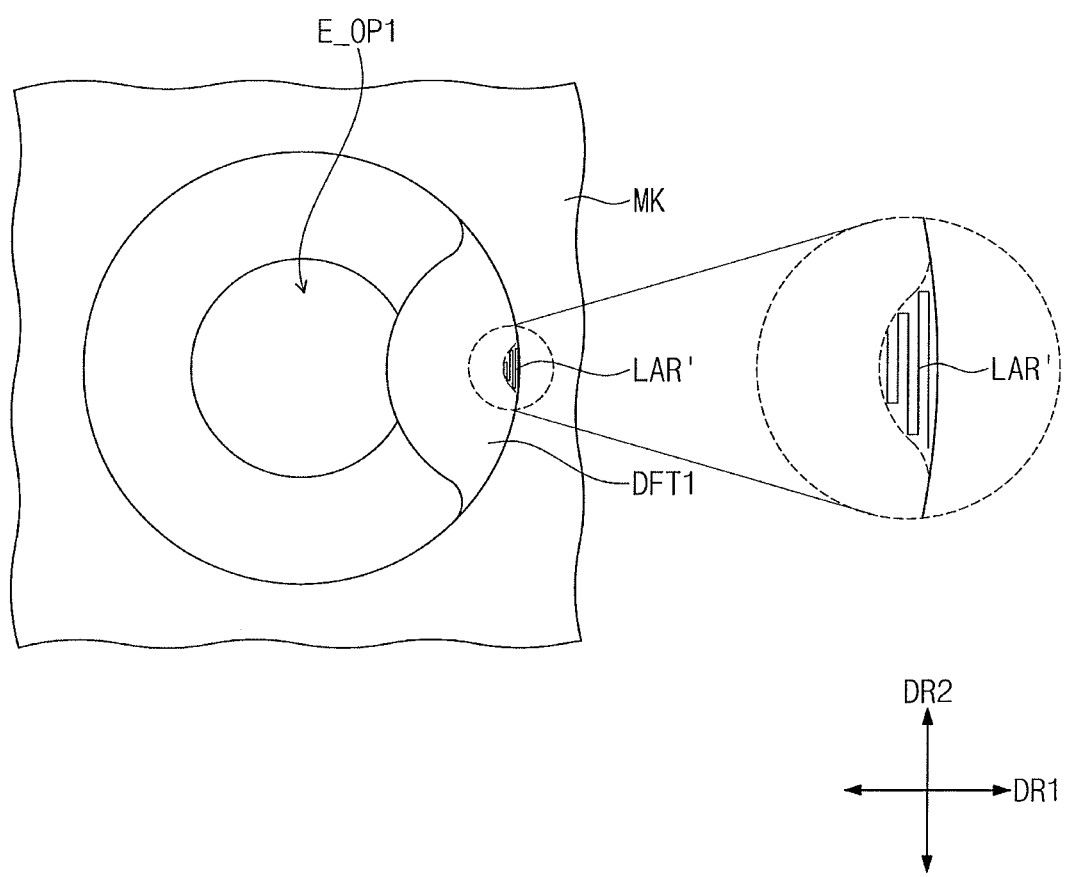
FIG. 19 illustrates a process of changing a focus position of a laser beam, according to an embodiment.

FIG. 19 is a diagram illustrating a process of changing a focus position of a laser beam, according to an embodiment. As an example, FIG. 19 shows a plan view corresponding to FIG. 10.

Referring to FIG. 19, the laser beam LAR' may be provided to the first deficient part DFT1 while repeatedly moving in the second direction DR2 and the first direction DR1. A moving distance of the laser beam LAR' may be larger in the second direction DR2 than in the first direction DR1, e.g., the laser beam LAR' may be scanned along the second direction DR2, translated along the first direction DR1, and then scanned along the second direction DR2.

In the previous embodiments of FIG. 10, the moving distance of the laser beam LAR may be longer in the first direction DR1, but the moving distance of the laser beam LAR' in FIG. 19 may be longer in the second direction DR2 than in the first direction DR1. Except for the difference in the moving direction of the laser beam LAR', the operation of removing the first deficient part DFT1 may be performed in substantially the same manner as that described with reference to FIGS. 10 to 16.

Figure 20:
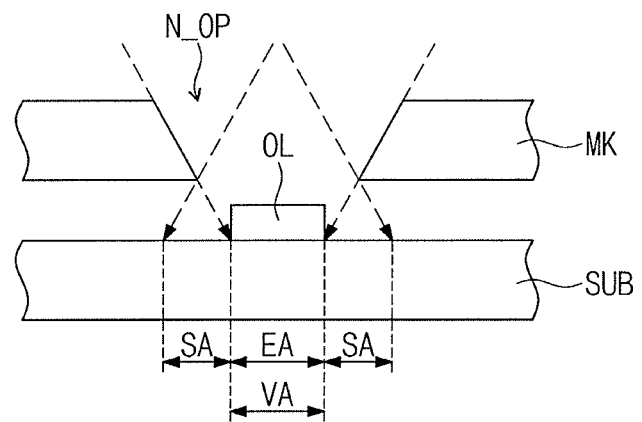
FIG. 20 illustrates a deposition material provided on a substrate through a normal opening.
Figure 21:
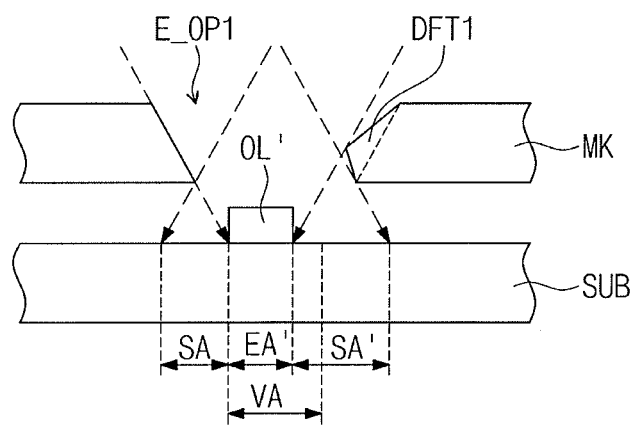
FIG. 21 illustrates a deposition material provided on a substrate through an abnormal opening.

FIG. 20 illustrates a deposition material provided on a substrate through a normal opening. FIG. 21 illustrates a deposition material provided on a substrate through an abnormal opening. In detail, FIG. 21 shows an example of the first abnormal opening E_OP1 defined by the first deficient part DFT1.

Referring to FIG. 20, a substrate SUB may face the first surface S1. A deposition material, e.g., evaporated from a crucible, may be provided on the substrate SUB through the normal opening N_OP. For convenience in illustration, a traveling direction of the deposition material is illustrated by a dotted arrow.

The substrate SUB may include a valid region VA on which an organic light emitting layer is to be formed. A region of the substrate SUB to which the deposition material is provided may be defined as a deposition region EA. When the deposition material is provided to the substrate SUB through the normal opening N_OP, the deposition region EA coincides with the valid region VA. Thus, the deposition material may be normally provided onto the valid region VA to form an organic light emitting layer OL on the valid region VA of the substrate SUB.

A width of the normal opening N_OP may increase in along the third direction DR3 away from the substrate SUB. In this case, the deposition material may be provided onto a shadow region SA around the deposition region EA. When the normal opening N_OP is used, the shadow region SA may be set within an error margin of a deposition process.

Referring to FIG. 21, when the deposition material is provided onto the substrate SUB through the first abnormal opening E_OP1, a deposition region EA', to which the deposition material is provided, may be smaller than the deposition region EA of FIG. 20. Since the deposition material is abnormally provided onto the substrate SUB, the deposition region EA' may be smaller than the valid region VA. In this case, an organic light emitting layer OL' may be abnormally formed on the substrate SUB.

Due to the first deficient part DFT1, the deposition material may be provided to a shadow region SA' around the deposition region EA'. The shadow region SA' of FIG. 21 may be larger than the shadow region SA of FIG. 20, and in certain cases, the shadow region SA' may be formed in a region beyond the error margin of the deposition process. Although the first abnormal opening E_OP1 is described as an example of abnormal openings, the same issue may occur in the second and third abnormal openings E_OP2 and E_OP3.

In an embodiment, since the abnormal openings E_OP1, E_OP2, and E_OP3 are precisely repaired and used as normal openings N_OP, the mask MK may be effectively used to perform a deposition process.

By way of summation and review, to increase the number of the organic light emitting devices, a mask with more openings is used to form organic light emitting patterns. However, when the number of the openings provided in the mask increases it is difficult to precisely form the openings, leading to an increase in failure ratio of a mask.

A mask repair apparatus and a mask repair method according to an embodiment may allow deficient parts of a mask to be removed in a more precise manner. Thus, abnormal openings of the mask may be repaired more precisely.

According to an embodiment, a mask repairing method may include disposing a mask having a plurality of openings on a stage, producing a stereoscopic image of the mask and dividing the stereoscopic image into n first multi-level images, comparing the n first multi-level images with n second multi-level images of a normal image of the mask to produce m multi-level defect images, and sequentially removing m multiple layers of a deficient part of the mask, based on the m multi-level defect images. The m multiple layers may correspond to the m multi-level defect images, respectively.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A mask repairing method, comprising:
    producing a stereoscopic image of a mask, in which a plurality of openings are defined;
    comparing the stereoscopic image with a normal image of the mask to produce a defect image of the mask, the defect image of the mask comprising m multi-level defect images corresponding to m multiple layers of a deficient part; and
    irradiating a laser beam onto the deficient part of the mask to remove the deficient part, based on the defect image,
    wherein the laser beam is sequentially irradiated onto the m multiple layers of the deficient part while repeatedly moving in a first direction and a second direction crossing each other to sequentially remove the m multiple layers, where m is a natural number.

2. The method as claimed in claim 1, wherein:
    each normal opening of a plurality of openings has a width increasing in a direction from a first surface of the mask to a second surface of the mask, and
    the second surface is opposite to and above the first surface.

3. The method as claimed in claim 2, wherein producing the stereoscopic image of the mask includes:
    measuring a stereoscopic image of an exposed surface of the mask exposed when viewed in a top plan view of the mask; and
    setting a virtual side surface to be perpendicular from an edge of the deficient part to a bottom of the mask, when the edge of the deficient part in the measured stereoscopic image is between the first surface and the second surface.

4. The method as claimed in claim 1, wherein producing the defect image includes:
    dividing the stereoscopic image into n first multi-level images; and
    comparing the n first multi-level images with n second multi-level images of the normal image to produce the m multi-level defect images,
    wherein the m multiple layers correspond to the m multi-level defect images, respectively, where n is a natural number and m is a natural number equal to or smaller than the n.

5. The method as claimed in claim 4, wherein producing the m multi-level defect images includes removing portions corresponding to the n second multi-level images from the n first multi-level images to produce the m multi-level defect images.

6. The method as claimed in claim 4, wherein the m multiple layers are removed from a topmost layer of the m multiple layers in a sequential and downward manner.

7. The method as claimed in claim 1, wherein a moving distance of the laser beam is larger in one of the first and second directions than in the other direction.

8. A mask repairing method, comprising:
    disposing a mask having a plurality of openings on a stage;
    producing a stereoscopic image of the mask and dividing the stereoscopic image into n first multi-level images;

comparing the n first multi-level images with n second multi-level images of a normal image of the mask to produce m multi-level defect images; and sequentially removing m multiple layers of a deficient part of the mask, based on the m multi-level defect images, wherein the m multiple layers correspond to the m multi-level defect images, respectively, and where n is a natural number and m is a natural number less than or equal to n.

9. The method as claimed in claim 8, wherein the m multiple layers are removed in a sequential manner from a topmost layer of the m multiple layers.

10. The method as claimed in claim 8, wherein removing the m multiple layers includes sequentially irradiating a laser beam onto the m multiple layers while repeatedly moving in a first direction and a second direction crossing each other to sequentially remove the m multiple layers.

* * * * *